(12) United States Patent
Kim et al.

(10) Patent No.: US 6,406,969 B2
(45) Date of Patent: Jun. 18, 2002

(54) METHOD OF MANUFACTURING A THIN FILM TRANSISTOR ARRAY SUBSTRATE

(75) Inventors: Hye-Young Kim, Taejon; Soon-Ku Huh, Kyoungsangbuk-do, both of (KR)

(73) Assignee: LG. Philips LCD Co., Ltd., Seoul (KR)

( * ) Notice: Subject to any disclaimer, the term of this patent is extended or adjusted under 35 U.S.C. 154(b) by 42 days.

(21) Appl. No.: 09/734,010

(22) Filed: Dec. 12, 2000

(30) Foreign Application Priority Data

Dec. 21, 1999 (KR) .......................................... 1999-59601

(51) Int. Cl.[7] ............................................... H01L 21/20
(52) U.S. Cl. ........................ 438/384; 438/151; 438/165; 438/257; 438/586; 438/724
(58) Field of Search ................................. 438/384, 158, 438/151, 152, 160, 586, 126, 165, 587, 723, 724, 740, 257, 264

(56) References Cited

U.S. PATENT DOCUMENTS

| | | | | |
|---|---|---|---|---|
| 5,915,172 A | * | 6/1999 | Noumi et al. | 438/151 |
| 5,953,084 A | * | 9/1999 | Shimada et al. | 349/38 |
| 6,080,606 A | * | 6/2000 | Gleskova et al. | 438/151 |
| 6,100,954 A | * | 8/2000 | Kim et al. | 349/138 |
| 6,117,791 A | * | 9/2000 | Ko et al. | 438/723 |
| 6,281,955 B1 | * | 8/2001 | Midorikawa et al. | 349/106 |
| 6,309,926 B1 | * | 10/2001 | Bell et al. | 438/257 |

* cited by examiner

*Primary Examiner*—Caridad Everhart
*Assistant Examiner*—Igwe U. Anya
(74) *Attorney, Agent, or Firm*—Long Aldridge & Norman, LLP

(57) ABSTRACT

A method of manufacturing a thin film transistor array substrate that includes photolithographically forming an active layer on a substrate. The photoresist mask remaining on the substrate is then removed using a stripper. After stripping, the substrate is immersed in a thin alkali-based solution. The array substrate is then cleaned using distilled water. Source and drain electrodes are then formed on the active layer.

19 Claims, 6 Drawing Sheets

METHOD OF MANUFACTURING A THIN FILM TRANSISTOR ARRAY SUBSTRATE

This application claims the benefit of Korean Patent Application No. 1999-59601, filed on Dec. 21, 1999, which is hereby incorporated by reference for all purposes as if fully set forth herein.

BACKGROUND OF THE INVENTION

1. Field of the Invention

The present invention relates to thin film transistors and to liquid crystal display (LCD) devices.

2. Discussion of the Related Art

In general, a LCD includes upper and lower substrates and an interposed liquid crystal layer. The upper substrate includes a color filter and a common electrode, while the lower substrate includes an array of switching elements and a pixel electrode. The liquid crystal layer is comprised of optically anisotropic liquid crystal molecules that arrange according to the state of the switching element.

The lower substrate is often referred to as an array substrate. That substrate is manufactured using various processes such as deposition, photolithography, and etching. Manufacturing the lower substrate involves repeating those processes several times. Of the various processes, the principles of the present invention most directly relate to photolithography. Therefore, photolithography will be explained in more detail.

FIG. 1 is a photolithography flow chart, and FIGS. 2A to 2D are cross-sectional views illustrating a typical photolithography process. In general, photolithography includes deposition, (light) exposure, and development.

First, as shown in FIG. 2A, a thin film 11 is deposited on a glass substrate 10. Referring now to ST100 of FIG. 1, after the deposition of the thin film 11 the glass substrate 10 is pre-baked to remove humidity on the substrate's surface. This enhances adhesion between the glass substrate 10 and a subsequently deposited photoresist 13. Thereafter, the photoresist 13 is uniformly coated on the thin film 11 using spin-coating. Then, a soft-bake process that evaporates solvents remaining in the photoresist 13 is performed. This hardens the photoresist 13. The result is as illustrated in FIG. 2a.

ST200 of FIG. 1 is carried out by placing the glass substrate 10 in a light exposure device and aligning the glass substrate with a photomask. This is shown in FIG. 2B, which shows a mask 15. The glass substrate 10 then undergoes light exposure for a predetermined period of time. Beneficially, the light exposure uses ultra-violet (UV) radiation. Due to the light exposure and the mask 15, the portion of the photoresist 13 that is not protected by the mask 15 is polymerized.

After polymerization, ST 300 of FIG. 1 is performed as illustrated by FIG. 2C. Depending on the particular process being used, either the exposed portion or the non-exposed portion of the photoresist 13 is selectively removed by a developer. The result is a photoresist pattern 13. To enhance the adhesion of the photoresist pattern 13 to the thin film 11 the glass substrate 10 is hard-baked by performing a heat-treatment at a predetermined temperature.

After the hard-bake, ST400 (etch) of FIG. 1 is performed as shown in FIG. 2D. Using either a dry or a wet etch process, the thin film 11 is selectively removed with the photoresist 13 acting as a mask. The result is a thin film pattern 11a. In other words, a portion of the thin film 11 that is not covered with the photoresist pattern 13 is removed.

After the etch, ST500 (strip) of FIG. 1 is performed, also as illustrated in FIG. 2D. The photoresist 13 on the thin film pattern 11a is removed using a chemical stripper. After stripping, a cleaning process is carried out, beneficially one that uses distilled water. Since the stripper tends to stick to and solidify on the surface of the substrate 10, the substrate is first immersed in an isopropyl alcohol solution ($(CH_3)_2CHOH$) to prevent stripper solidification. Then, the substrate 10 is cleaned using distilled water.

The structure of a conventional array substrate that is manufactured using the foregoing photolithography process is explained below. FIG. 3 is a plan view illustrating an array substrate of a conventional LCD device. As shown in FIG. 3, gate lines 19 are arranged in a transverse direction, and data lines 21 are arranged in a longitudinal direction. Pixel electrodes P are formed at a region defined by the gate and data lines 19 and 21. Thin film transistors (TFTs) are formed at a crossing portion of the gate and data lines 19 and 21. A storage capacitor C is formed adjacent the gate line 19. A portion of the gate line 19 is used as a first electrode of the storage capacitor C, and a portion of the pixel electrode P is used a second electrode. Alternatively, a separate capacitor electrode can be formed and used instead of the portion of the gate line 19.

Each TFT includes a gate electrode 23, an active layer 29, a source electrode 25, and a drain electrode 27 that is spaced apart from the source electrode. The end portion of the active layer 29 is overlapped by the source and drain electrodes 25 and 27.

Each of the foregoing components is formed by photolithography. As the ends of the active layer 29 is overlapped by the source and drain electrodes 25 and 27, the surface of the active layer 29 must be completely clean to prevent problems. Therefore, as described above, the array substrate is immersed in the isopropyl alcohol solution after removing the photoresist using the stripper solution.

However, the isopropyl alcohol solution adversely affects an insulating layer that is beneficially located under the active layer 29. In addition, the isopropyl alcohol solution is relatively costly. Therefore, an improved method of manufacturing a thin film transistor array substrate would be beneficial.

SUMMARY OF THE INVENTION

Accordingly, the present invention is directed to a method of manufacturing a thin film transistor array substrate that substantially obviates one or more of the problems due to limitations and disadvantages of the related art.

To overcome the problems described above, preferred embodiments of the present invention provide a method of manufacturing a thin film transistor array substrate that includes an effective method of cleaning an active layer of a thin film transistor.

Another object of the present invention is to provide a method of manufacturing a thin film transistor array substrate that includes a low cost process of cleaning an active layer of a thin film transistor.

Additional features and advantages of the invention will be set forth in the description that follows, and in part will be apparent from that description, or may be learned by practice of the invention. The objectives and other advantages of the invention will be realized and attained by the structure particularly pointed out in the written description and claims hereof as well as the appended drawings.

To achieve the above objects, the principles of the present invention provide a method of manufacturing a thin film transistor array substrate that includes forming a gate electrode on a substrate, and then sequentially forming a first insulating layer, a pure semiconductor layer and a doped semiconductor layer that cover the gate electrode. A photoresist layer is then coated on the doped semiconductor layer. The photoresist layer is then exposed and developed to form a photoresist pattern. The pure semiconductor layer and the doped semiconductor layer are then etched to form an active layer and an ohmic contact layer by using the photoresist pattern as a mask. The photoresist pattern is then removed using a stripper. The array substrate is then immersed into a thin alkali-based solution. The array substrate is then cleaned using distilled water. Spaced apart source and drain electrodes are then formed on the ohmic contact layer.

The method further includes forming a second insulating layer over the array substrate, and then forming a pixel electrode on the second insulating layer such that the pixel electrode contacts the drain electrode.

Beneficially, the alkali-based solution is diluted tetramethylamonium hydroxide (TMAH; $(CH_3)_4NOH$). The first and second insulating layers are beneficially comprised of inorganic material such as SiNx and SiOx, or of an organic material such as BCB (benzocyclobutene) or an acrylic-based resin. The pixel electrode is beneficially comprised of ITO (indium tin oxide) and/or of IZO (indium zinc oxide). The gate electrode is beneficially comprised of Al, an Al alloy, Mo, Ta, W and/or of Sb. The source and drain electrodes are beneficially comprised of Cr and/or of a chrome alloy.

By using a method of manufacturing a TFT array substrate according to the principles of the present invention, the cleaning of the active layer of a TFT can be improved. In addition, since an alkali-based solution is relatively low cost when compared to an isopropyl alcohol solution, the cost of cleaning the active layer of a thin film transistor can be reduced.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF AN ILLUSTRATED EMBODIMENT

Reference will now be made in detail to an illustrated embodiment of the present invention, the example of which is shown in the accompanying drawings.

Figure 1:
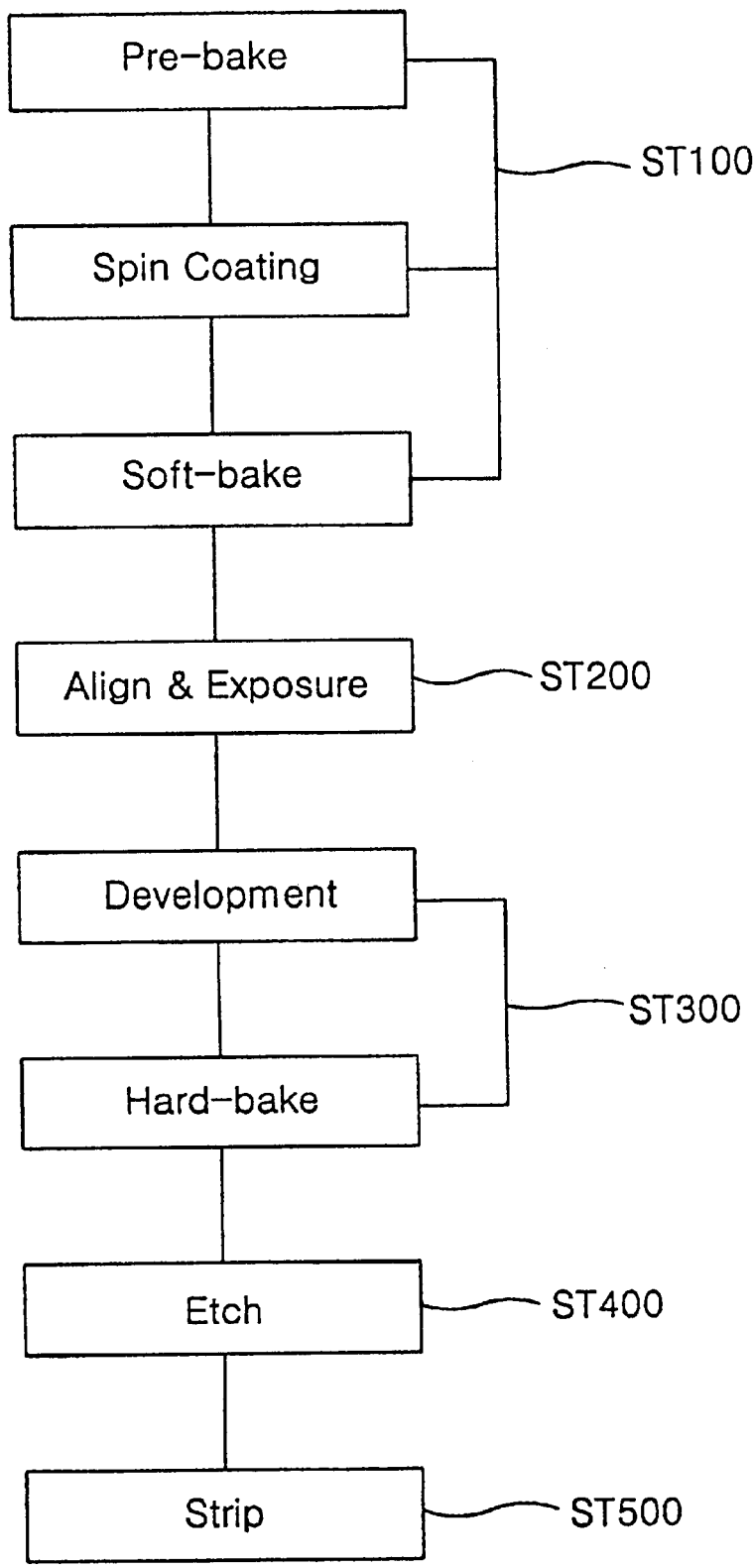
FIG. 1 is a flow chart illustrating a photolithography process.
Figure 2A:
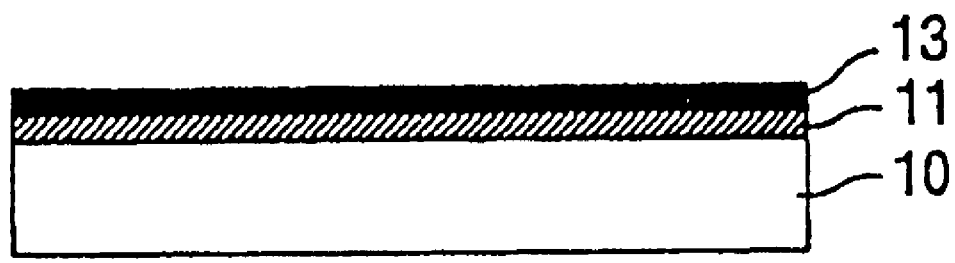
FIGS. 2A to 2D are cross-sectional views illustrating the process of FIG. 1.
Figure 2B:
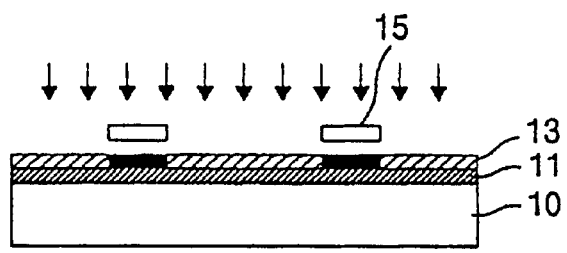
Figure 2C:
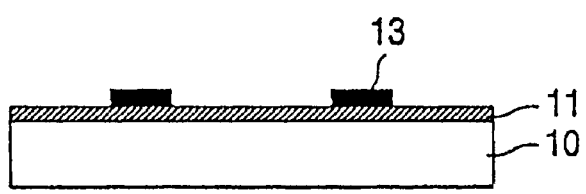
Figure 2D:
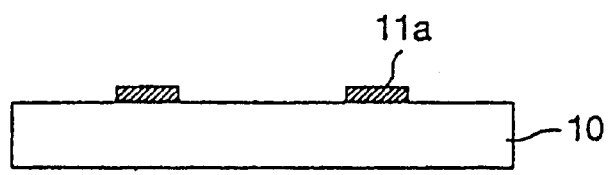
Figure 3:
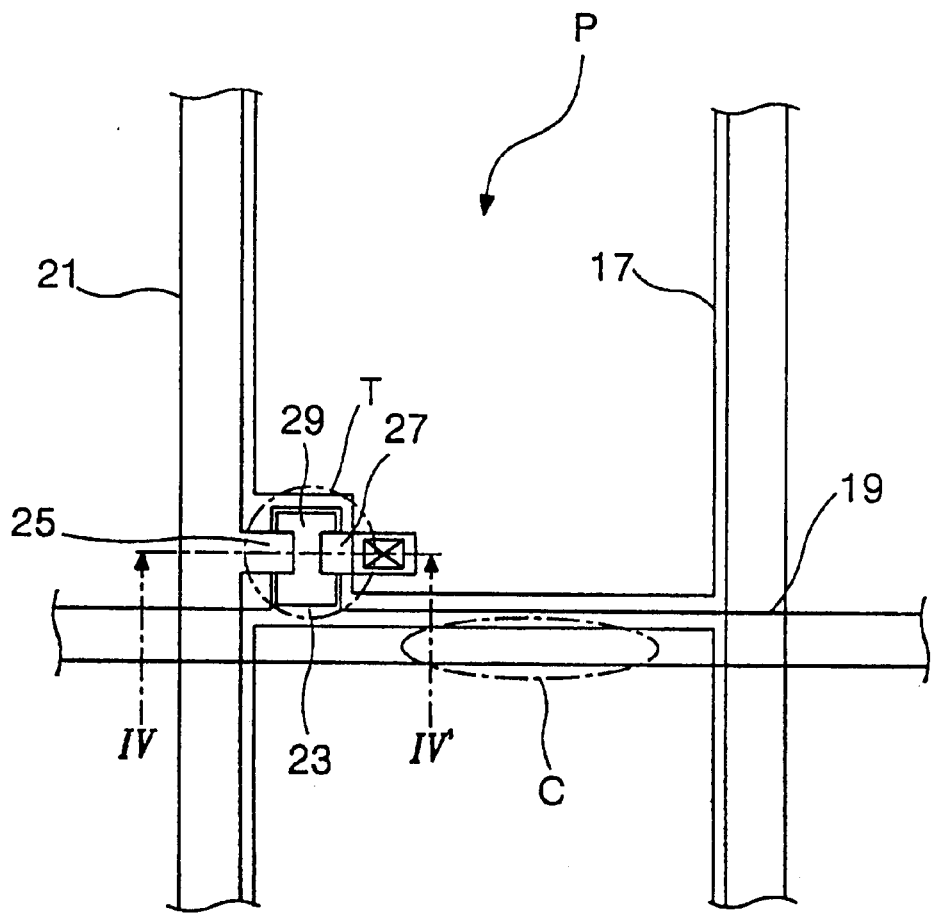
FIG. 3 is a plan view illustrating the structure of an array substrate of a conventional LCD device.
Figure 4A:
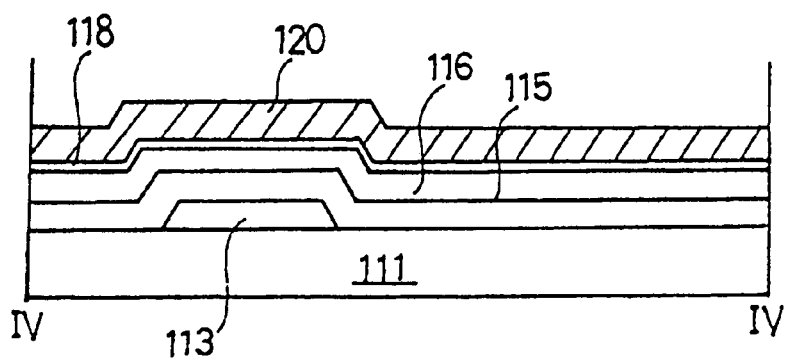
FIGS. 4A to 4E are cross-sectional views taken along line IV—IV of FIG. 3 and help illustrate a process of manufacturing a thin film transistor array substrate according to the principles of the present invention.

FIGS. 4A to 4E are cross-sectional views taken along line IV—IV of FIG. 3. Those views help illustrate a process of manufacturing a thin film transistor (TFT) array substrate according to the principles of the present invention. First, as shown in FIG. 4A, a first metal layer is deposited on a glass substrate 111. The first metal layer is beneficially made of a metal such as Al, an Al alloy, Mo, Ta, W, and/or Sb. A photoresist layer is then coated on the first metal layer and patterned to form a first mask.

The photoresist pattern is then heat-treated (forming a hemispherical-shaped cross-section). With the photoresist pattern acting as a mask, the first metal layer is etched to form a gate line (see 19 of FIG. 3) and a taper-shaped gate electrode 113. Using a dry-etching technique to etch the first metal layer is preferable since the etching ratio is proportional to the flow rate of the etching gas, which is easy to control.

Next, a first insulating layer 115 is formed over the substrate 111 such that the first insulating layer covers the gate electrode 113. The first insulating layer 115 is beneficially comprised of an inorganic material such as SiNx and SiOx, or of an organic material such as BCB (benzocyclobutene) and an acrylic-based resin.

Then, a pure amorphous silicon layer 116 and a doped amorphous silicon layer 118 are sequentially deposited over the substrate. A photoresist layer 120 is then coated over the doped semiconductor layer 118. The photoresist 120 is then light exposed using a second mask. The photoresist 120 is then developed to form a photoresist pattern 120a (reference FIG. 4B).

Figure 4B:
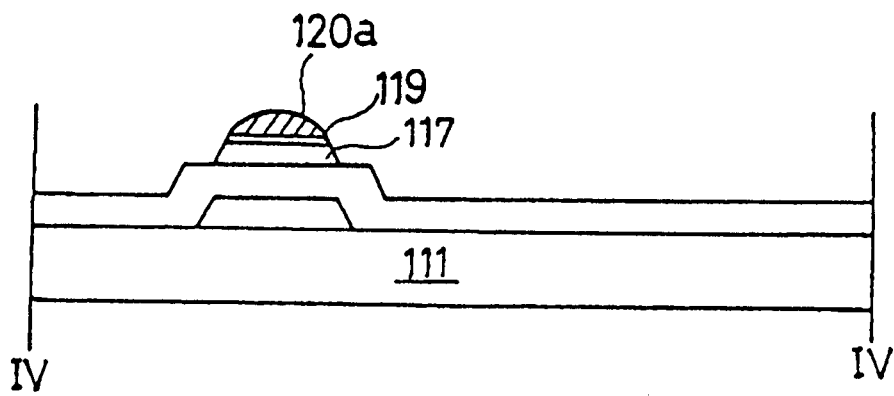

As shown in FIG. 4B, using the photoresist pattern 120a as a mask, the exposed portions of the doped semiconductor layer 118 and the pure amorphous silicon layer 116 are simultaneously etched to form an active layer 117 and an ohmic contact layer 119. The remaining photoresist pattern 120a is then removed using an organic stripper.

After that, the array substrate is immersed in a thin alkali-based solution, for example, diluted tetramethylamonium hydroxide (TMAH; $(CH_3)_4NOH$). This prevents the stripper from solidifying before it can be cleaned using distilled water. The thin alkali-based solution serves to improve the cleaning of the first insulating layer 115 under the active layer 117. Furthermore, a thin alkali-based solution is relatively low cost. After immersion in the thin alkali-based solution the substrate is cleaned using distilled water.

Figure 4C:
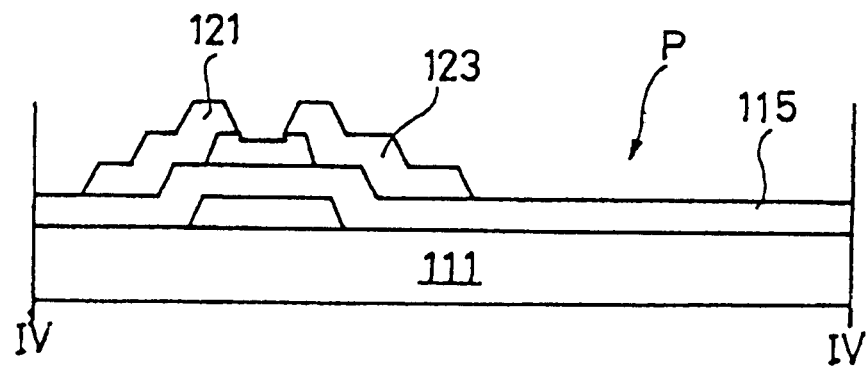

After the cleaning of the active layer 117 and the first insulating layer 115, as shown in FIG. 4C, a second metal layer is deposited and patterned using a third mask into a data line (see element 21 of FIG. 3) and source and drain electrodes 121 and 123. The second metal layer is beneficially made of Cr or a chrome alloy. When etching the second metal layer either a dry etching technique or a wet etching technique can be used.

Figure 4D:
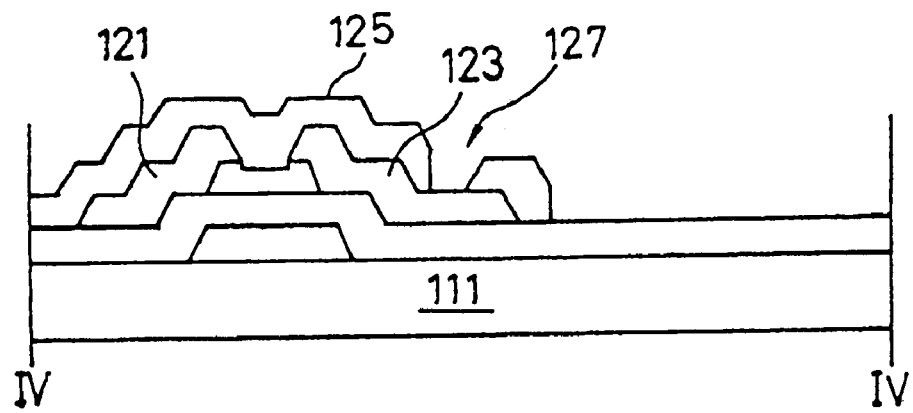

Subsequently, as shown in FIG. 4d, a second insulating layer is formed over the substrate 111. The second insulating layer is made of either an inorganic material such as SiNx and SiOx or an organic material such as BCB (benzocyclobutene) and acrylic-based resin. The second insulating layer forms a passivation film 125. Then, the passivation film 125 is patterned using a fourth mask to form a contact hole 127 to the drain electrode 123.

Figure 4E:
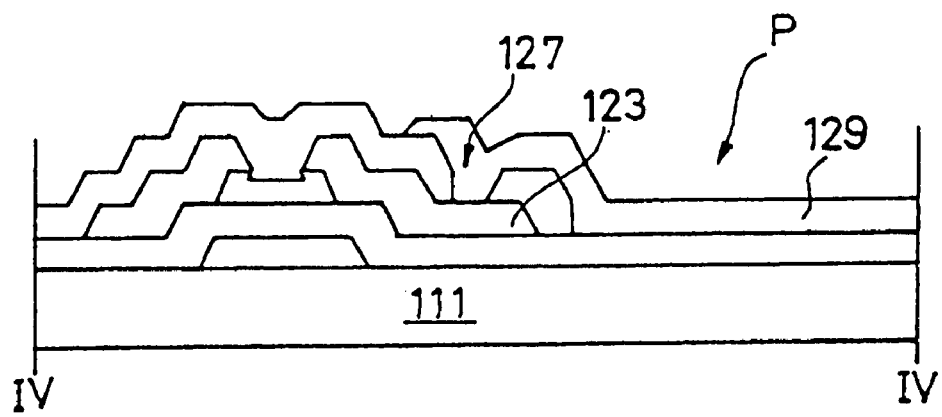

Finally, as shown in FIG. 4e, a transparent conductive metal layer is deposited on the passivation film 125. The conductive metal layer is then patterned into a pixel electrode 129 using a fifth mask. The pixel electrode 129 contacts the drain electrode 123 through the contact hole 127. The pixel electrode 129 is beneficially made of ITO (indium tin oxide) or IZO (indium zinc oxide).

As described above, using a method of manufacturing a TFT array substrate according to the principles of the present invention the active layer is cleaned using an alkali-based solution. Cleaning is effective and lower in cost than methods that use an isopropyl alcohol solution.

It will be apparent to those skilled in the art that various modifications and variation can be made in the present invention without departing from the spirit or scope of the invention. Thus, it is intended that the present invention covers the modifications and variations of this invention provided they come within the scope of the appended claims and their equivalents.

What is claimed is:

1. A method of manufacturing a thin film transistor array substrate, comprising:

forming a gate electrode on a substrate;

sequentially forming a first insulating layer and a semiconductor layer over the gate electrode;

coating the semiconductor layer with a photoresist;

exposing and developing the photoresist to form a photoresist pattern;

etching the semiconductor layer using the photoresist pattern as a mask to form an active layer;

removing the photoresist pattern using a stripper;

immersing the stripped array substrate into a thin alkali-based solution; and cleaning the array substrate using distilled water.

2. The method according to claim 1, wherein the forming of the semiconductor layer includes forming a pure semiconductor layer and forming a doped semiconductor layer on the pure semiconductor layer.

3. The method according to claim 2, wherein the etching of the semiconductor layer etches the doped semiconductor layer to form an ohmic contact.

4. The method according to claim 3, further including forming a drain electrode on the ohmic contact.

5. The method according to claim 3, further including forming a source electrode on the ohmic contact.

6. The method of claim 1, wherein the alkali-based solution is a diluted solution of tetramethylamonium hydroxide (TMAH; $(CH_3)_4NOH$).

7. The method of claim 4, further comprising:

forming a second insulating layer over the source electrode and over the drain electrode;

exposing the drain electrode by forming an opening through the second insulating layer; and forming a pixel electrode on the second insulating layer such that the pixel electrode electrically contacts the drain electrode via the opening through the second insulating layer.

8. The method of claim 7, wherein the first and second insulating layers are formed of an inorganic material.

9. The method of claim 8, wherein the inorganic material includes silicon.

10. The method of claim 7, wherein the first and second insulating layers are formed of an organic material.

11. The method of claim 10, wherein the first and second insulating layers are formed of benzocyclobutene.

12. The method of claim 10, wherein the first and second insulating layers are formed of acryl-based resin.

13. The method of claim 7, wherein the pixel electrode is formed from indium.

14. The method of claim 13, wherein the pixel electrode is formed from indium tin oxide.

15. The method of claim 13, wherein the pixel electrode is formed from indium zinc oxide.

16. The method of claim 1, wherein the gate electrode is formed from a material from a group consisting of Al, Al alloy, Mo, Ta, W and Sb.

17. The method of claim 1, wherein the source and drain electrodes are formed from Cr.

18. The method of claim 1, wherein the source and drain electrodes are formed from a chrome alloy.

19. The method of claim 1, wherein the stripper is comprised of an organic material.

\* \* \* \* \*